(12) United States Patent
Hartmann et al.

(10) Patent No.: US 7,220,664 B2
(45) Date of Patent: May 22, 2007

(54) FABRICATION METHOD FOR SEMICONDUCTOR STRUCTURE IN A SUBSTRATE, THE SEMICONDUCTOR STRUCTURE HAVING AT LEAST TWO REGIONS THAT ARE TO BE PATTERNED DIFFERENTLY

(75) Inventors: Stephan Hartmann, Flein (DE); Dirk Offenberg, Kleve-Kellen (DE); Mirko Vogt, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/061,731

(22) Filed: Feb. 22, 2005

(65) Prior Publication Data
US 2005/0191843 A1     Sep. 1, 2005

(30) Foreign Application Priority Data
Feb. 20, 2004   (DE)   ..................... 10 2004 008 497

(51) Int. Cl.
*H01L 21/4763* (2006.01)

(52) U.S. Cl. ..................... 438/618; 438/637; 438/638; 438/238; 257/E27.084

(58) Field of Classification Search ........ 438/238–256, 438/381–399, 618–677
See application file for complete search history.

(56) References Cited

U.S. PATENT DOCUMENTS 6,159,840 A * 12/2000 Wang ........................ 438/618

FOREIGN PATENT DOCUMENTS

| DE | 19940581 C2 | 4/2001 |
| DE | 10153310 A1 | 5/2003 |

* cited by examiner

*Primary Examiner*—H. Jey Tsai
(74) *Attorney, Agent, or Firm*—Morrison & Foerster LLP (57) ABSTRACT

The present invention provides a fabrication method for a semiconductor structure in a substrate, the semiconductor structure having at least two regions that are to be patterned differently. A fabrication of a patterned first region in the substrate, so that the semiconductor structure has a non-patterned second region and the patterned first region, is followed by a deposition of a cover layer that grows over the patterned first region, so that the cover layer above the patterned first region forms a closure, which covers over the patterned first region. This is followed by a fabrication of the patterned second region, the patterned first region remaining protected at least by the closure of the cover layer. The final step effected is a removal of the cover layer above the semiconductor structure, which now has two differently patterned regions.

14 Claims, 6 Drawing Sheets

FABRICATION METHOD FOR SEMICONDUCTOR STRUCTURE IN A SUBSTRATE, THE SEMICONDUCTOR STRUCTURE HAVING AT LEAST TWO REGIONS THAT ARE TO BE PATTERNED DIFFERENTLY

CLAIM FOR PRIORITY

This application claims priority to German Application No. 10 2004 008 497.1 filed Feb. 20, 2004, which is incorporated herein, in its entirety, by reference.

TECHNICAL FIELD OF THE INVENTION

The present invention relates to a fabrication method for a semiconductor structure in a substrate, the semiconductor structure having at least two regions that are to be patterned differently.

BACKGROUND OF THE INVENTION

Although applicable in principal to any desired integrated circuits, the present invention and also the problem area on which it is based are explained with regard to integrated memory circuits in silicon technology.

The fabrication of integrated circuits involves patterning layers or layer systems. The same layer or the same layer system is/are generally patterned differently in different successive method steps, and, if appropriate in different regions of the semiconductor substrate. As is known, organic antireflection layers or photosensitive resists are again applied to already patterned regions of the semiconductor structure and are patterned by means of lithography, for example, in order, in a further method step, to perform the desired patterning by transferring the structures into the layering or layer systems. Besides organic antireflection layers, hard masks (also mutlilayered) are also used, which may lead to a multistage patterning process.

As is known, the following problems arise according to the above procedure. Antireflection layers or photoresists flow into the already patterned regions present. The thickness of the antireflection layer or of the photoresist is reduced in the vicinity of the already patterned regions. The reduced thickness produced in the vicinity of the already patterned regions possibly no longer suffices for subsequent process steps (e.g. etches).

On account of an antireflection layer or photoresist running into the already patterned regions, the antireflection layer or the photoresist is much thicker in the structures present and therefore cannot be completely removed, if appropriate.

According to the prior art, when using hard masks (mono-layered or multilayered) at the sidewalls of the already patterned regions, it is possible to find different layer thicknesses through to torn-away parts of the hard mask layers. Such different layer thicknesses or torn-away parts of the hard mask layers are typical weak points for the subsequent process steps (e.g. the tearing-away of an SiON layer on a carbon hard mask at an already prepatterned region leads to an attack on the carbon hard mask during for example a subsequent lithography process step, the carbon hard mask that is to be protected by the SiON layer disadvantageously being damaged or destroyed).

Moreover, as already mentioned above, the hard masks used are also deposited in the already patterned regions. Owing to the altered layer thicknesses in and near the already patterned regions and/or the different material properties of the foundations of the already patterned regions, the later removal (stripping) of the hard mask is made more difficult or is not possible.

As is known, it is attempted to solve the abovementioned problems by using the following method. The already patterned regions are filled by a planarizing organic layer. The projecting or excess material is removed again in a so-called recess step. The disadvantages here are as follows. The process sequence has an increased complexity and thereby causes increased costs. Moreover, the use of the planarizing organic layer limits the process temperature for subsequent method steps since the organic filling materials are thermo-stable only to a limited extent.

SUMMARY OF THE INVENTION

The present invention specifies a simple and reliable fabrication method for a semiconductor structure having at least two regions that are to be patterned differently.

Accordingly, in one embodiment of the invention, there is a fabrication method of a patterned first region in the substrate, so that the semiconductor structure has a non-patterned second region and the patterned first region. Subsequent deposition of a cover layer that grows over the patterned first region, so that the cover layer above the patterned first region forms a closure, which covers over the patterned first region. This is followed by fabrication of the patterned second region, the patterned first region remaining protected at least by the closure of the cover layer. Concluding removal of the cover layer above the semiconductor structure which has the two differently patterned regions.

One advantage of the method according to the invention is that the already patterned regions remain protected for subsequent method steps by virtue of the cover layer, which is deposited in a manner such that existing patterned regions are covered in closed fashion by it. In particular, antireflection layers or photoresists can no longer flow into the already patterned regions.

Another advantage of the invention is that, given a suitable choice of material for the cover layer, the latter can simultaneously be utilized for other purposes, in particular itself as a hard mask.

In accordance with one preferred embodiment, the covering over of the patterned first region by a cover layer and the fabrication of the patterned second region are provided by means of the following method: deposition of a cover layer on the horizontal planes of the semiconductor structure, the cover layer growing over the patterned first region, so that the cover layer above the patterned first region forms a closure, which covers over the patterned first region, and forms a horizontal surface above the semiconductor structure. Subsequent provision of a first barrier layer above the horizontal surface of the cover layer and provision of a second barrier layer above the first barrier layer. There follows provision of a structure by means of a first mask for the as yet unpatterned second region above the semiconductor structure and also transfer of the structure into the second barrier layer, so that the regions of the second barrier layer that are to be removed on account of the structure are selectively removed for the formation of a process window. This is followed by transfer of the structure into the first barrier layer, so that the regions of the first barrier layer that are to be removed on account of the structure are selectively removed for the further formation of the process window and transfer of the structure into the cover layer, so that the regions of the cover layer that are to be removed on account of the structure are selectively removed, thereby further forming the process window for the further patterning of the second region. Concluding fabrication of the patterned second region according to known method steps in the process window, the patterned first region remaining protected at least by the closure of the cover layer.

One advantage of the preferred embodiment is that the above method steps exhibit patterning of the regions that are to be patterned differently. Moreover, the overgrowth of the already patterned first region by the cover layer ensures the tightness of the additional barrier layers, on the one hand, and makes it possible to keep the removal process or stripping process simple, on the other hand.

In accordance with a further preferred embodiment, the cover layer is a carbon hard mask.

One advantage of the preferred embodiment is that, through the use of carbon as overgrowing and closing cover layer, the good light absorption of carbon can be utilized in order to be able to dispense with an additional organic antireflection layer. Carbon has outstanding hard mask properties.

In accordance with a further particularly preferred embodiment, the carbon hard mask is deposited by means of a plasma-chemical vapor deposition process (plasma enhanced chemical vapor deposition, PECVD), the process parameters being determined with 200 to 1000 sccm, preferably 350 sccm for the $C_3H_6$ flowrate, 3000 to 20 000 sccm, preferably 8000 sccm, for the He flowrate, 3.5 to 10 tor, preferably 5.5 tor for the process pressure and 800 to 3000 watts, preferably 1600 watts for the radiofrequency energy.

One advantage of the particularly preferred embodiment is that overhangs over underlying existing structures are created by means of the PECVD method with the process parameters specified above, the overhangs created having overhang angles of 35°–55°. The overhangs of the carbon hard mask advantageously cover over the underlying already patterned regions, so that the underlying already patterned regions remain protected for subsequent processes, e.g. etching processes.

In accordance with a further preferred embodiment, the first barrier layer is an SiON layer.

In accordance with a further preferred embodiment, the second barrier layer is a photosensitive resist.

In accordance with a further preferred embodiment, the first mask is a photomask.

In accordance with a further preferred embodiment, the patterned first region forms an electrical contact of a bit line of a DRAM memory cell within the substrate.

In accordance with a further preferred embodiment, the electrical contact of a bit line of a DRAM memory cell is led through two word lines of the DRAM memory cells, said word lines being insulated by means of a respective silicon nitride (SiN).

In accordance with a further preferred embodiment, the patterned second region forms a CS contact of a DRAM memory cell.

In accordance with a further preferred embodiment, a borophosphosilicate glass (BPSG) forms an insulating layer between the CS contact and the contact of the bit line of the DRAM memory cell, the second region to be patterned being provided with the borophosphosilicate glass in this case.

In accordance with a further preferred embodiment, the transfer of the structure into the first barrier layer, the SiON layer, is formed by means of an anisotropic fluorine-based etching process for the formation of the process window.

In accordance with a further preferred embodiment, the selective removal of the carbon hard mask is an anisotropic dry etching using an oxygen plasma, the entire photosensitive resist likewise being removed above the semiconductor structure in this case.

One advantage of this preferred embodiment is that a single method step for removal is necessary for the selective removal of the carbon hard mask and the removal of the photosensitive resist above the semiconductor structure on account of the similar material properties of the carbon hard mask and of the photosensitive resist. A reduction of the method steps advantageously means cost advantages in the fabrication of the semiconductor structure.

In accordance with a further preferred embodiment, the transfer of the structure into the cover layer is followed by a process of etching back the borophosphosilicate glass in the process window by means of an anisotropic fluorine-based process, the entire SiON layer likewise being removed above the semiconductor structure in this case.

One advantage of the preferred embodiment is that a single method step is necessary for the further formation of the process window into the borophosphosilicate glass and also for the removal of the entire SiON layer. A reduction of the method steps for the fabrication of the semiconductor structure advantageously means a lowering of the costs.

In accordance with a further preferred embodiment, removing the carbon hard mask above the semiconductor structure is an isotropic dry etching using an oxygen plasma.

BRIEF DESCRIPTION OF THE DRAWINGS

Exemplary embodiments of the invention are illustrated in the drawings and are explained in more detail in the description below.

In the figures, identical reference symbols designate identical or functionally identical component parts.

DETAILED DESCRIPTION OF THE INVENTION

Figure 1:
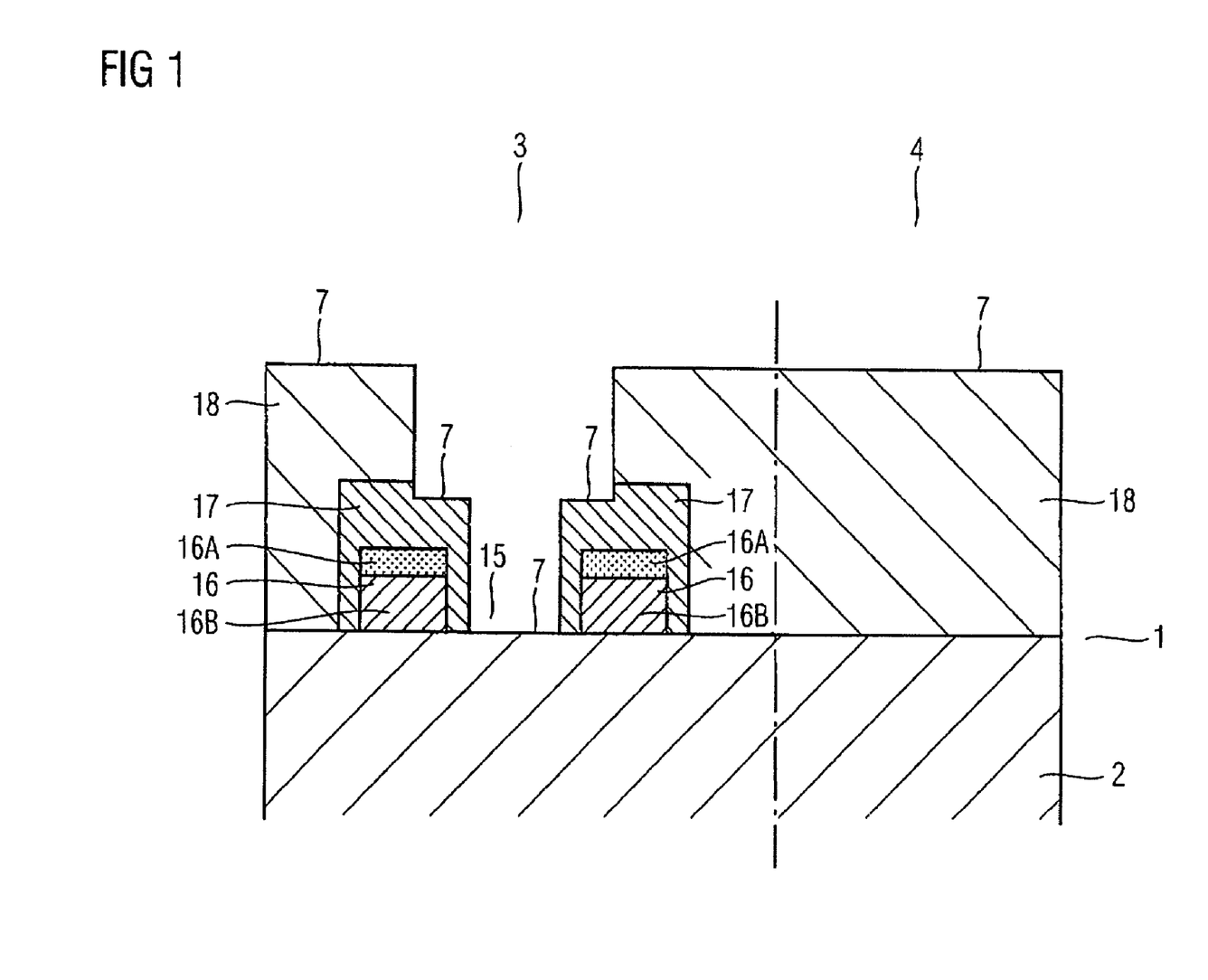
FIGS. 1 to 6 show successive method stages of a fabrication method as an embodiment of the present invention.

In FIG. 1, reference symbol 1 designates a semiconductor structure having two regions that are to be patterned differently, the first region 3 and the second region 4. FIG. 1 shows that the silicon substrate 2 has already been patterned in the first region 3. The patterned first region 3 has two word lines 16, which in each case comprise a tungsten part 16-A and a polysilicon part 16-B, of a DRAM memory cell. The two word lines 16 are in each case insulated by means of a silicon nitride 17.

An electrical contact of a bit line 15 of a DRAM memory cell is connected between the insulated word lines 16 via the silicon substrate 2.

Borophosphosilicate glass 18 acts as an insulating layer which keeps the different electrical contacts of the DRAM memory cell insulated from one another.

The electrical contact of a bit line 15 of the present semiconductor structure 1 is contact-connected upwardly via a hole in the borophosphosilicate glass 18.

It is an aim of the present invention to protect the already patterned first region 3 in such a way that the as yet unpatterned second region 4 can be patterned without impairing the first region 3.

Figure 2:
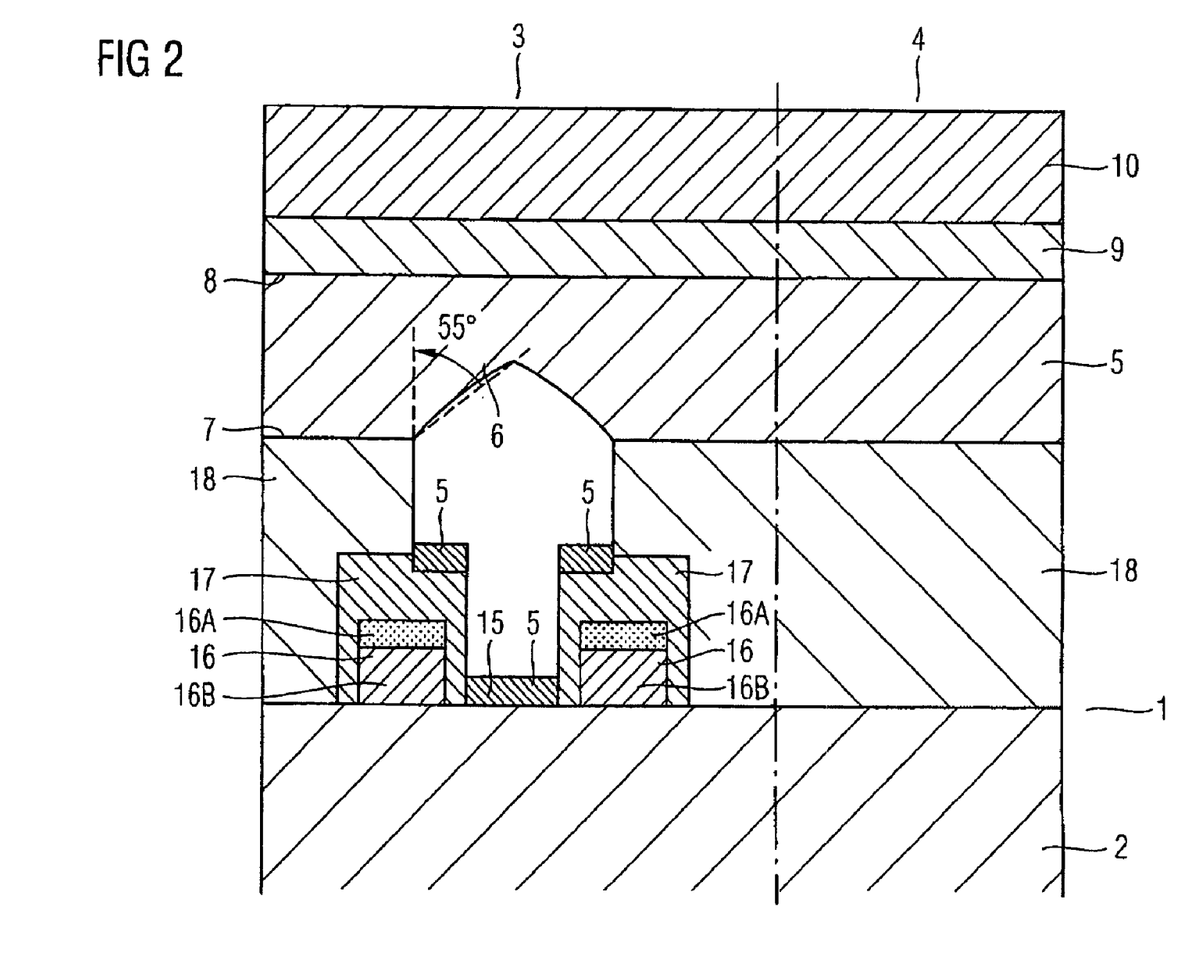

Referring further to FIG. 2, a carbon hard mask is then deposited as cover layer 5 on the semiconductor substrate 1, to be precise on the horizontal planes 7 of the semiconductor structure 1. Although material of the carbon hard mask 5 is also deposited within the already patterned region 3 at the beginning of the deposition, as soon as the patterned first region 3 is grown over by means of the carbon 5 deposited on the borophosphosilicate glass 18 and forms the closure 6 made from the cover layer or from the carbon hard mask 5, the already patterned region 3 is protected both from subsequent carbon and during further process steps.

FIG. 2 furthermore shows that the growing carbon hard mask 5 forms overhangs each having an overhang angle of 55°. The overhangs of the carbon hard mask 5 essentially form the closure 6.

A thin SiON layer 9 is subsequently deposited.

According to FIG. 2, a second barrier layer 10, e.g. photosensitive resist, is deposited in a further process step.

During the deposition of the photosensitive resist, it is not an unusual occurrence that the applied photosensitive resist does not correspond to the technical requirements and has to be removed again in order to deposit a new layer of photosensitive resist. The SiON layer 9 has the function of configuring the removal and the renewed application of the photosensitive resist 10 as simply as possible.

Moreover, on account of the thin SiON layer 9, the photoresist 10 has no plane of contact with the already applied carbon hard mask 5. Contamination of the carbon hard mask 5 on account of the applied photoresist 10 can be avoided by means of the SiON layer 9.

Figure 3:
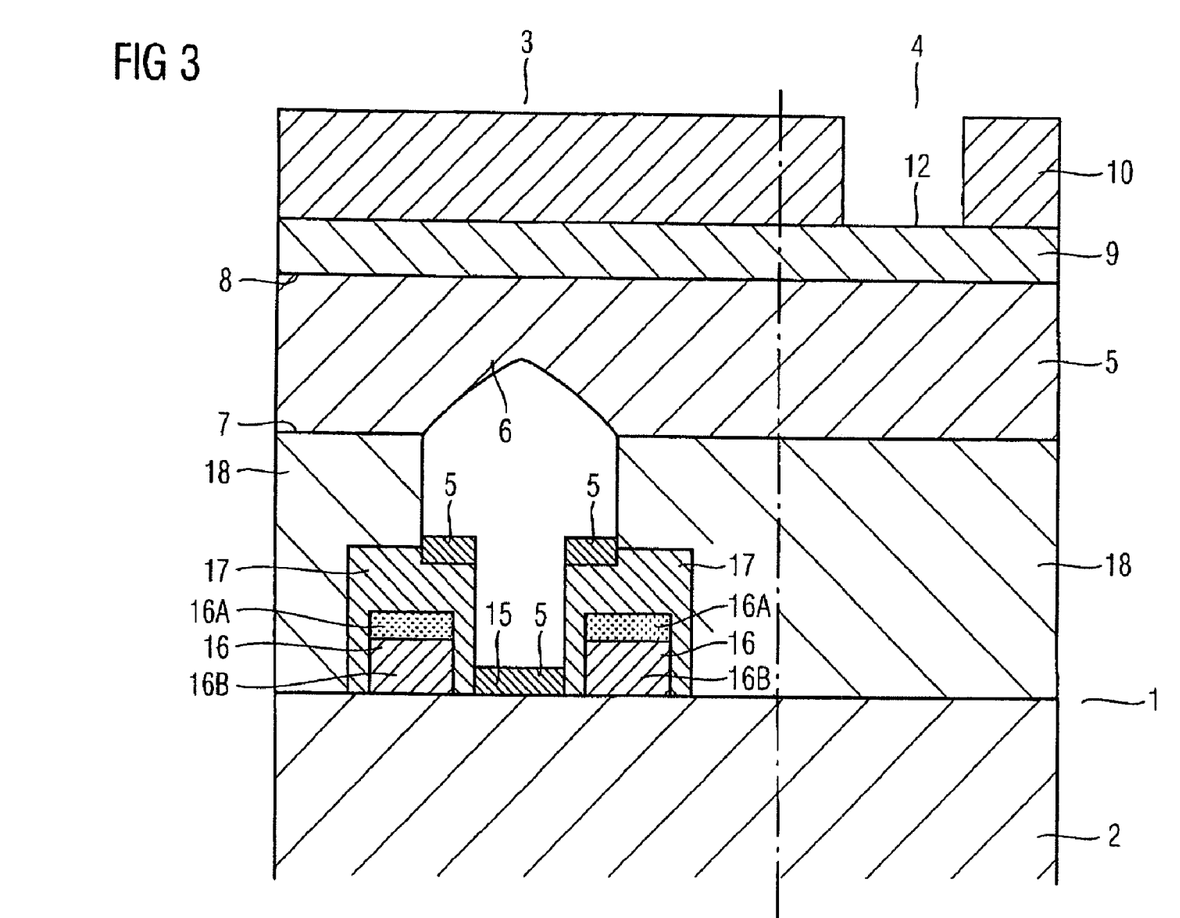

Referring further to FIG. 3, after a structure for patterning the second region 4 has been applied to the semiconductor structure 1 by means of a photomask, the structure is transferred into the second barrier layer 10, the SiON layer, so that the regions of the second barrier layer 10 that are to be removed on account of the structure are selectively removed for the formation of a process window 12.

In a subsequent method step, the SiON layer 9 is etched back by means of an anisotropic fluorine-based etching process for the further formation of the process window 12.

Figure 4:
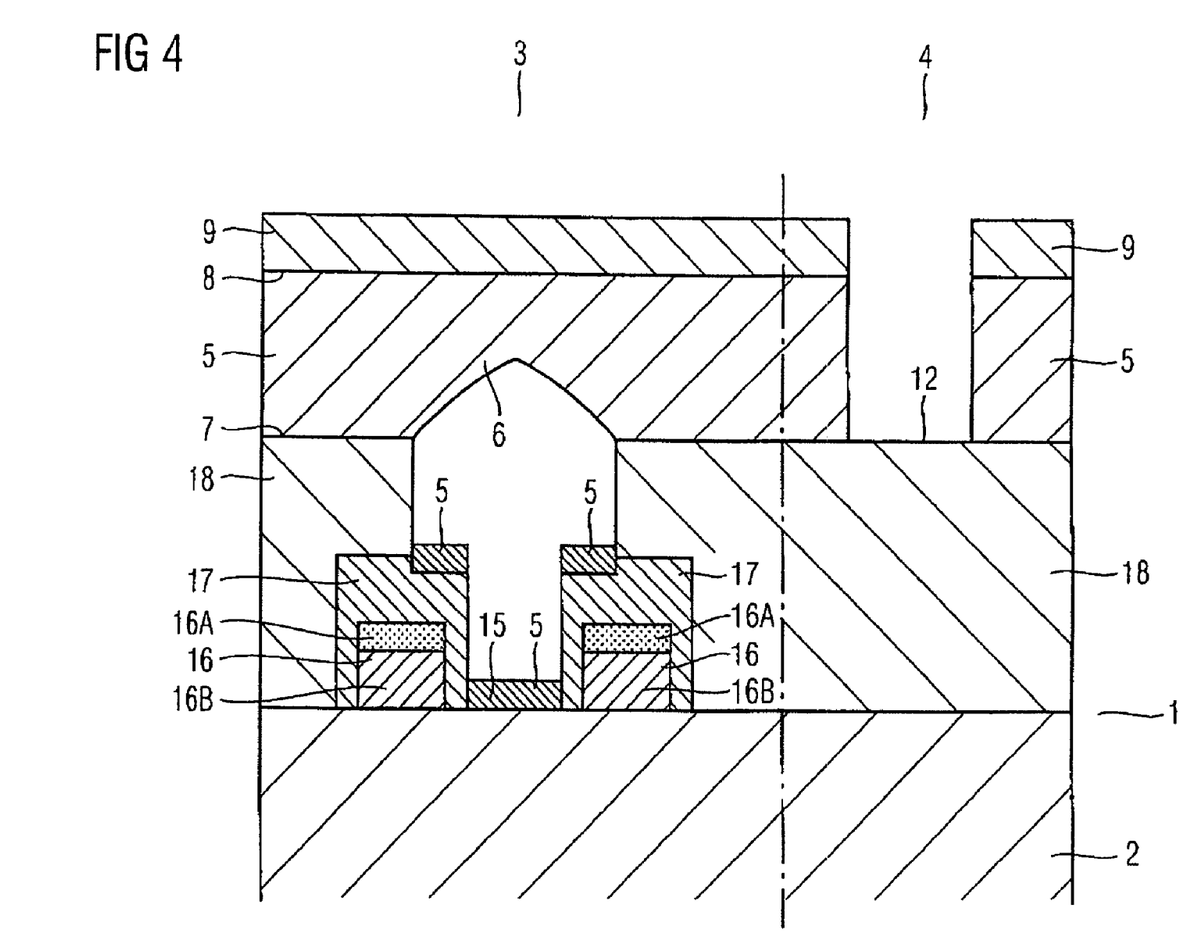

Referring further to FIG. 4, the carbon hard mask 5 is selectively removed by means of an anisotropic dry etching using an oxygen plasma in the process window 12, the entire photosensitive resist 10 likewise being removed above the semiconductor structure 1.

Figure 5:
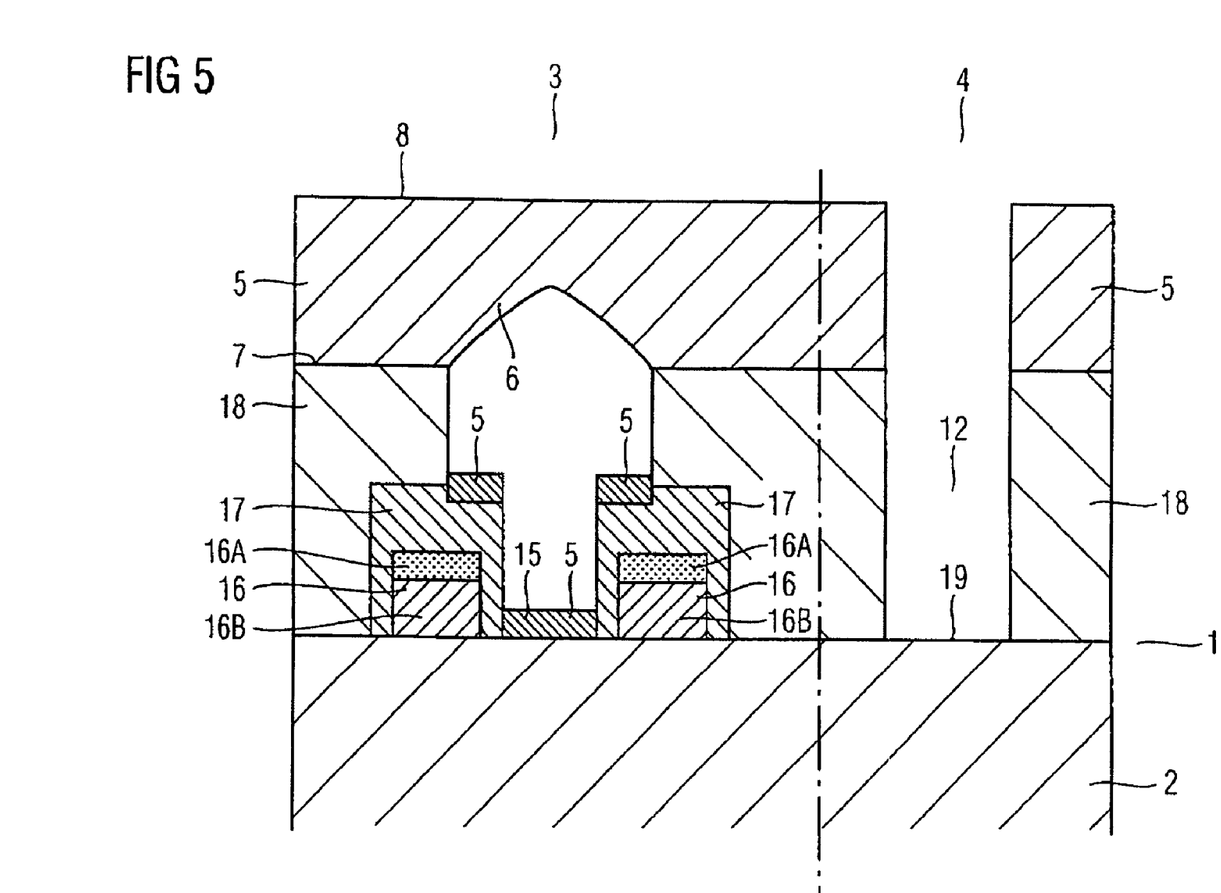

Referring further to FIG. 5, in the process window 12, the borophosphosilicate glass 18 is etched back in the second region 4 by means of an anisotropic fluorine-based process, the entire SiON layer 9 likewise being removed above the semiconductor structure 1 in this case.

This is followed by fabrication of the patterned second region 4 (not shown) according to known method steps, the patterned first region 3 remaining protected at least by the closure 6 of the cover layer 5.

Figure 6:
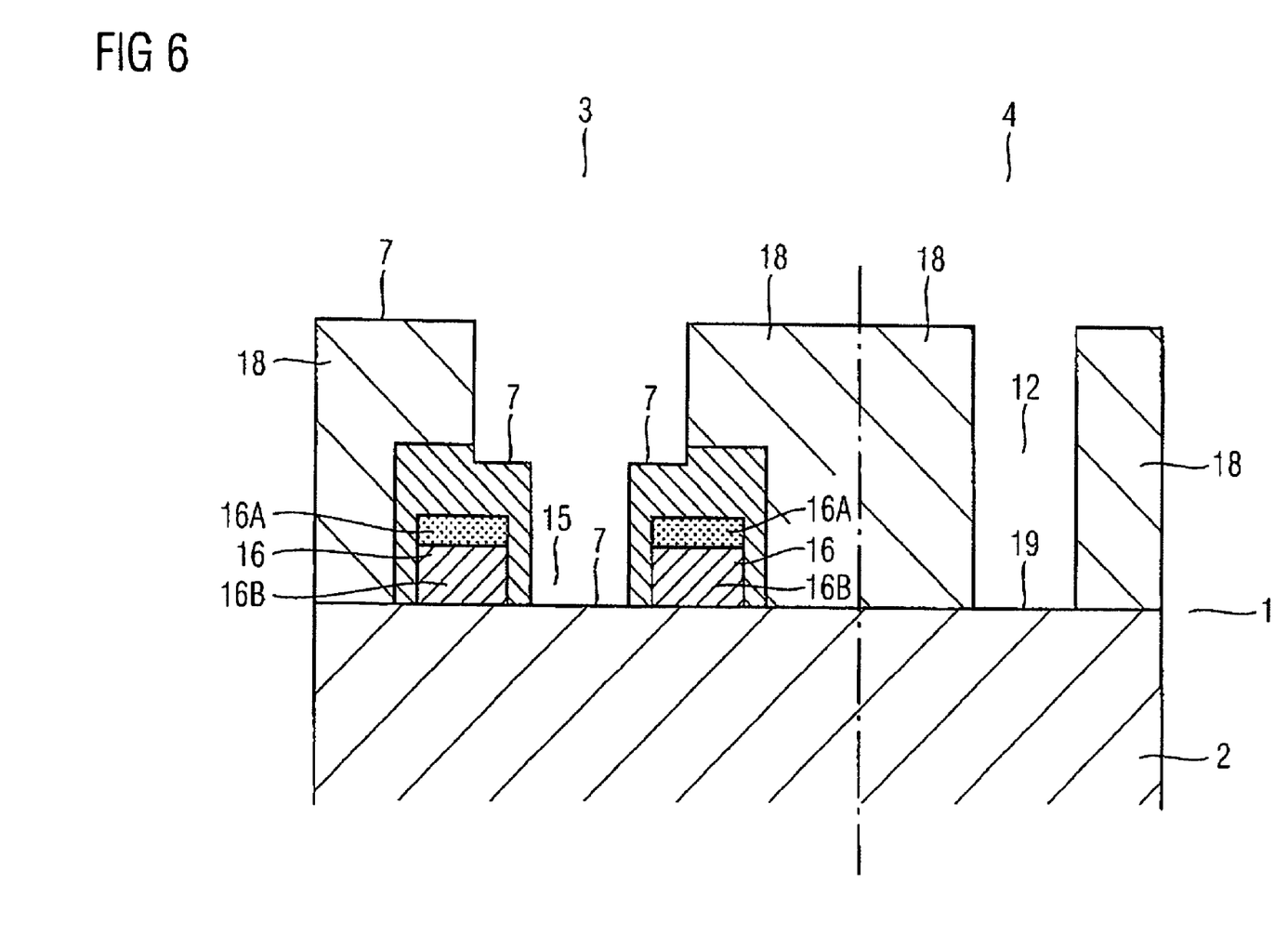

Referring further to FIG. 6, the cover layer 5, the carbon hard mask, is removed above the semiconductor structure 1, so that two differently patterned regions, the first region 3 and the second region 4, are formed and uncovered.

Moreover, that part of the cover layer 5 which was applied within the patterned first region is removed by this removal step.

Although the present invention has been described above on the basis of a preferred exemplary embodiment, it is not restricted thereto, but rather can be modified in diverse ways.

In particular, the selection of the materials, in particular of the barrier layers and of the regions to be patterned, is only by way of example and can be varied in many different ways.

What is claimed is:

1. A fabrication method for a semiconductor structure in a substrate, the semiconductor structure having at least two regions that are to be patterned differently, comprising:
   (a) fabricating a patterned first region in the substrate, so that the semiconductor structure has a non-patterned second region and the patterned first region;
   (b1) depositing a cover layer on horizontal planes of the semiconductor structure, the cover layer growing over the patterned first region, so that the cover layer above the patterned first region forms a closure, which covers over the patterned first region without completely filling the first region, and forms a horizontal surface above the semiconductor structure;
   (b2) providing a first barrier layer above the horizontal surface of the cover layer;
   (b3) providing a second barrier layer above the first barrier layer;
   (b4) providing a structure by means of a first mask for an unpatterned second region above the semiconductor structure;
   (b5) transferring the structure into the second barrier layer, so that the regions of the second barrier layer that are to be removed on account of the structure are selectively removed for the formation of a process window;
   (b6) transferring the structure into the first barrier layer, so that the regions of the first barrier layer that are to be removed on account of the structure are selectively removed for the further formation of the process window;
   (b7) transferring the structure into the cover layer, so that the regions of the cover layer that are to be removed on account of the structure are selectively removed, thereby further forming the process window for the further patterning of the second region; and
   (c1) fabricating the patterned second region in the process window, the patterned first region remaining protected at least by the cover layer; and
   (d) removing the cover layer above the semiconductor structure which has the two differently patterned regions.

2. The method according to claim 1, wherein the cover layer is a carbon hard mask.

3. The method according to claim 2, wherein the carbon hard mask is deposited by means of a plasma-chemical vapor deposition process, the process parameters being determined with 200 to 1000 sccm for the $C_3H_6$ flowrate, 3000 to 20000 sccm for the He flowrate, 3.5 to 10 torr for the process pressure and 800 to 3000 watts for the radiofrequency energy.

4. The method according to claim 1, wherein the first barrier layer is an SiON layer.

5. The method according to claim 1, wherein the second barrier layer is a photosensitive resist.

6. The method according to claim 1, wherein the first mask is a photomask.

7. The method according to claim 1, wherein the first patterned region, according to (a) forms an electrical contact of a bit line of a DRAM memory cell within the substrate.

8. The method according to claim 7, wherein the electrical contact of a bit line is led through two word lines of the DRAM memory cells, the word lines being insulated by means of a respective silicon nitride.

9. The method according to claim 1, wherein the second patterned region forms a CS contact of a DRAM memory cell.

10. The method according to claim 9, wherein a borophosphosilicate glass is provided as insulating layer between the CS contact and the contact of the bit line of the DRAM memory cell.

11. The method according to claim 4, wherein according to (b6) the SiON layer is etched back by means of an anisotropic, fluorine-based process for formation of the process window.

12. The method according to claim 2, wherein the selective removal of the carbon hard mask, according to (b7), is an anisotropic dry etching using an oxygen plasma, an entire photo-sensitive resist being removed above the semiconductor structure.

13. The method according to claim 10, wherein according to (b7), the borophosphosilicate glass is etched back in the process window by means of an anisotropic fluorine-based process, the first barrier layer being removed above the semiconductor structure.

14. The method according to claim 2, wherein the removal of the carbon hard mask, according to (d), is an isotropic dry etching using an oxygen plasma.

* * * * *